(12) United States Patent
Ferrera et al.

(10) Patent No.: US 9,061,248 B1
(45) Date of Patent: Jun. 23, 2015

(54) PROCESS FOR MANUFACTURING A MICROMECHANICAL STRUCTURE HAVING A BURIED AREA PROVIDED WITH A FILTER

(71) Applicant: STMicroelectronics S.r.l., Agrate Brianza (IT)

(72) Inventors: Marco Ferrera, Concorezzo (IT); Matteo Perletti, Boltiere (IT); Igor Varisco, Settimo Milanese (IT); Luca Zanotti, Agrate Brianza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/133,290

(22) Filed: Dec. 18, 2013

Related U.S. Application Data

(62) Division of application No. 13/190,254, filed on Jul. 25, 2011, now Pat. No. 8,633,553.

(30) Foreign Application Priority Data

Jul. 26, 2010 (IT) .............................. TO2010A0641

(51) Int. Cl.
*H01L 21/00* (2006.01)
*B01D 67/00* (2006.01)
*B01D 71/02* (2006.01)
*B01L 3/00* (2006.01)
*F04B 19/00* (2006.01)

(52) U.S. Cl.
CPC ............ *B01D 67/0062* (2013.01); *B01D 71/02* (2013.01); *B01L 3/502707* (2013.01); *F04B 19/006* (2013.01)

(58) Field of Classification Search
USPC .................. 438/50–53; 257/415–51, E21.002
See application file for complete search history.

(56) References Cited

U.S. PATENT DOCUMENTS

| | | | |
|---|---|---|---|
| 4,895,500 | A | 1/1990 | Hök et al. |
| 5,753,014 | A | 5/1998 | Van Rijn |
| 7,294,536 | B2 | 11/2007 | Villa et al. |
| 8,633,553 | B2 | 1/2014 | Ferrera et al. |
| 2001/0024820 | A1* | 9/2001 | Mastromatteo et al. ... 435/287.2 |
| 2003/0150791 | A1 | 8/2003 | Cho et al. |
| 2003/0168396 | A1* | 9/2003 | Jacobson ................. 210/321.75 |
| 2006/0001039 | A1 | 1/2006 | Zamanian |

(Continued)

FOREIGN PATENT DOCUMENTS

| | | |
|---|---|---|
| CN | 1938945 A | 3/2007 |
| EP | 1 324 382 A1 | 7/2003 |

*Primary Examiner* — Khaja Ahmad
(74) *Attorney, Agent, or Firm* — Seed IP Law Group PLLC

(57) ABSTRACT

A process for manufacturing a micromechanical structure envisages: forming a buried cavity within a body of semiconductor material, separated from a top surface of the body by a first surface layer; and forming an access duct for fluid communication between the buried cavity and an external environment. The method envisages: forming an etching mask on the top surface at a first access area; forming a second surface layer on the top surface and on the etching mask; carrying out an etch such as to remove, in a position corresponding to the first access area, a portion of the second surface layer, and an underlying portion of the first surface layer not covered by the etching mask until the buried cavity is reached, thus forming both the first access duct and a filter element, set between the first access duct and the same buried cavity.

19 Claims, 5 Drawing Sheets

(56) References Cited

U.S. PATENT DOCUMENTS

| | | |
|---|---|---|
| 2006/0278580 A1 | 12/2006 | Striemer et al. |
| 2006/0284299 A1 | 12/2006 | Karnezos |
| 2007/0126071 A1* | 6/2007 | Corona et al. ............... 257/415 |
| 2008/0261345 A1 | 10/2008 | Villa et al. |
| 2010/0089868 A1 | 4/2010 | Scheuerer et al. |

* cited by examiner

PROCESS FOR MANUFACTURING A MICROMECHANICAL STRUCTURE HAVING A BURIED AREA PROVIDED WITH A FILTER

BACKGROUND

1. Technical Field

The present disclosure relates to a process for manufacturing a micromechanical structure having a buried area provided with a filter. In one embodiment, the micromechanical structure is formed in a body made of semiconductor material, in particular silicon, using micromachining techniques and finds advantageous use, for example, for microfluidic applications.

2. Description of the Related Art

As is known, in the semiconductor industry micromachining techniques enable manufacturing of micromechanical or MEMS (microelectromechanical systems) structures, which have a wide range of applications.

In particular, in the microfluidic field, it is common to manufacture structures including buried areas (for example channels, chambers, or cavities) within a silicon substrate (or other semiconductor material body), which are for example used for enabling passage of fluids, such as drugs that are to be administered to a patient or inks used for printing operations, or else for enabling even complex chemical reactions, such as reactions of multiplication of DNA sequences through the PCR (polymerase chain reaction) process.

In general, the manufactured buried areas enable an environment to be obtained that is substantially separate and distinct from the external environment (and possibly communicates with the external environment by means of one or more access ducts), in which chemical reactions, exchanges or flows of fluids take place in a controlled manner.

Known processes for manufacturing of microfluidic structures provided with buried areas generally envisage the use of techniques of processing from the back of the silicon substrate or wafer (or other body of semiconductor material). These processes envisage chemical etching of the back of the substrate to define a first wall, for example a top wall, of the area that is to be buried (which defines, for example, a channel or a cavity), and next bonding of the substrate with a different structural body (for example, a plate of glass or an adhesive layer), such as to close the buried area defining a corresponding second wall thereof, for example a bottom wall. These operations can be carried out, in part, during the processes for assembling the package or "molding" of the microfluidic structures (operations known as a whole as "back-end" operations).

In addition, ducts for access to the buried area can be provided with purposely designed etches from the front of the substrate (techniques of silicon processing known as a whole as "front-end" techniques).

These manufacturing processes have, however, certain drawbacks that do not enable full exploitation of the characteristics thereof, amongst which:

the techniques of back processing, and the subsequent operations of bonding between different bodies, entail generally the generation of undesirable particles and contaminants, which can jeopardize operation of the final microfluidic device; and the back-end and bonding operations are in general complex, costly, and generally require long processing times.

In particular, the problem of contamination from external particles, which is not due only to the aforesaid manufacturing operations and to the residue of processing, but also to the presence for other reasons of external particles that can interact with the buried area, is particularly felt, in so far as this contamination can jeopardize the performance of the microfluidic devices or proper execution of the operations of delivery or passage of the fluids associated thereto.

For this reason, the use of more or less complex filters has been proposed, which are designed to be coupled to at least one access duct (inlet or outlet duct) in fluid communication with the buried cavity. In particular, given that these filters have pores of micrometric or sub-micrometric dimensions, they enable filtering and subsequent removal of possible impurities during flow of the liquids.

For example, U.S. Pat. No. 5,753,014 discloses the formation of a membrane filter by means of chemical etching of a silicon membrane having a thickness of a few microns. In particular, the membrane is obtained by means of chemical etching from the back of a silicon substrate, and a desired pattern of micrometric or sub-micrometric pores is subsequently defined through the membrane with photolithographic techniques. The membrane filter thus obtained can be coupled, as an external element, to structures with buried areas or ducts with a diameter (size) of from a few microns up to hundreds of microns or even millimeters, for operations of filtering of the incoming/outgoing fluids.

This solution is not, however, optimized from the standpoint of simplicity and economy of the manufacturing process, for example because it requires complex steps of coupling of the filter to structures formed separately, it requires to comply with specifications of mechanical and/or optical alignment, and moreover it does not enable in any case reduction of the contaminations in the manufacturing process of the buried areas.

Solutions are also known in which the filtering element is defined by bonding two bodies so as to define vertical pillars arranged according to desired lattices in a direction transverse to the direction of flow of the fluids. These solutions suffer from further disadvantages, amongst which: the process of bonding of the various bodies suffers from misalignment inaccuracy, the value of which (for example +/−20 μm) may not enable formation of sufficiently small filtering pores (for example of a diameter of 0.5 μm); during the bonding operation, the distance between the vertical pillars and the body facing them may not be sufficiently repeatable for enabling an adequate filtering action; and furthermore, in order to obtain adequate flows of fluids, the buried channels have, for example, a height of some tens of microns (for example, a height of 50 μm), with the consequent fragility of the aforesaid pillars that extend vertically from the bottom wall to the top wall of the channels (failure of the pillars can jeopardize the filtering action and can itself cause impurities in the flow of the fluids).

BRIEF SUMMARY

One embodiment of the present disclosure is a process that enables formation, in a body of semiconductor material, of buried areas provided with structures for filtering of contaminating impurities, and that is simple and inexpensive to implement.

According to the present disclosure a process for manufacturing a micromechanical structure having a buried area provided with a filter, and a corresponding micromechanical structure, are consequently provided as defined in the annexed claims.

BRIEF DESCRIPTION OF THE SEVERAL VIEWS OF THE DRAWINGS

For a better understanding of the present disclosure, a preferred embodiment thereof is now described, purely by way of non-limiting example and with reference to the attached drawings, wherein:

FIG. 2 shows a schematic top plan view of a portion of the body of semiconductor material of FIG. 1a;

DETAILED DESCRIPTION

A manufacturing process according to one embodiment of the present disclosure is now described; it is to be noted that some initial steps of the manufacturing process are, at least in part, based upon the processes described in U.S. Pat. No. 7,294,536 and U.S. Application Publication No. 2008/261345, which are incorporated herein by reference.

Figure 1A:
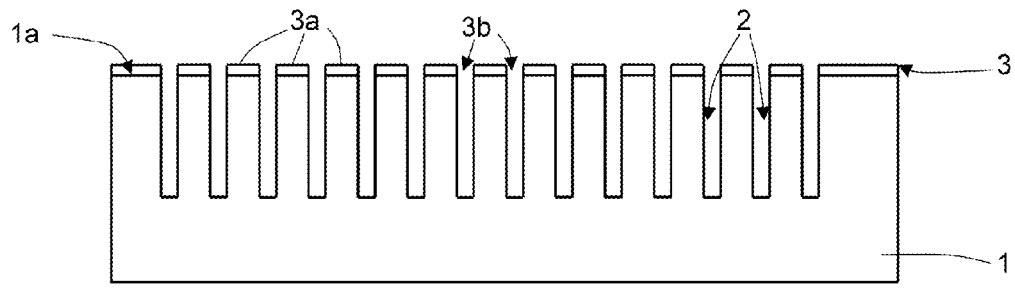
FIGS. 1a-1j show schematic cross sections of a body of semiconductor material, in successive steps of a process for manufacturing a micromechanical structure including a buried area provided with a filter, according to one aspect of the present disclosure.

As shown in FIG. 1a (not drawn to scale, as neither are the subsequent figures), an initial step of the manufacturing process envisages formation, within a substrate 1 of monocrystalline silicon, of a plurality of trenches 2. The trenches 2 are formed, such as by etching, through a surface portion of the substrate 1 by means of known techniques of masking and anisotropic chemical etching.

In particular, a mask 3 is formed on a top surface 1a of the substrate 1, the mask being made of a material resistant to chemical etching, for example photoresist.

Figure 2:
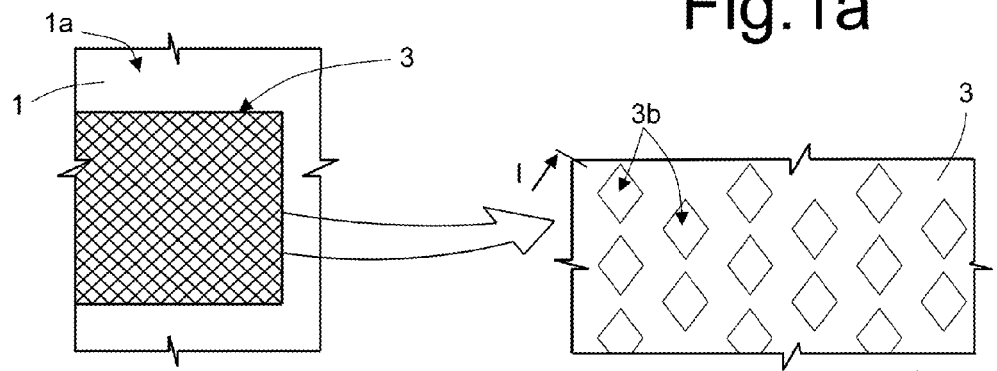

The mask 3 extends (see also the top plan view of FIG. 2) over an area having a shape substantially corresponding to the extension of the buried area that will be subsequently obtained (as described in detail hereinafter), and has a lattice conformation, for example a honeycomb conformation. FIG. 1a shows portions 3a of the mask 3, defining between them empty spaces 3b (the portions 3a are connected to form the aforesaid lattice).

The trenches 2, which have vertical extension, are formed by means of markedly anisotropic chemical etching of the substrate 1, in regions corresponding to the empty spaces 3b left by the mask 3, and have, for example, a depth of from 5 µm to 500 µm.

Figure 1B:
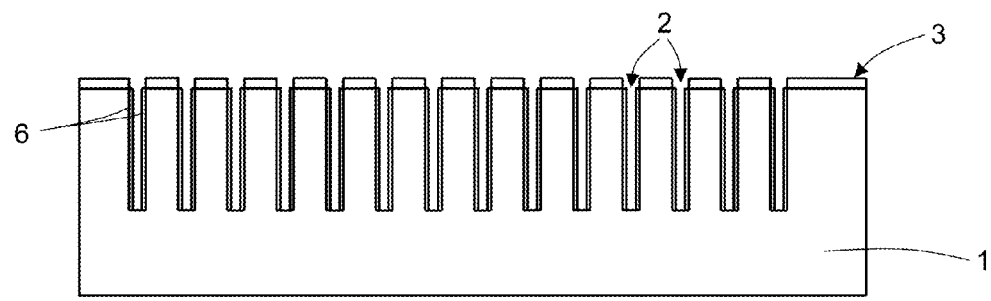

Next (FIG. 1b), once again with the mask 3 positioned on the top surface 1a of the substrate 1, a deposition of silicon oxide ($SiO_2$) or other dielectric material (such as silicon oxynitride or nitride) is carried out in such a way as to form spacers 6 on the internal lateral walls of the trenches 2 (the silicon dielectric possibly formed on the bottom of the trenches 2 is, instead, removed with an anisotropic etch).

Figure 1C:
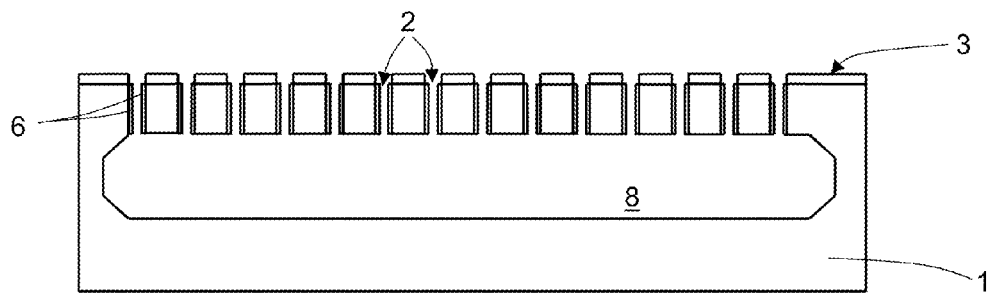

Then (FIG. 1c), a step of chemical etching is carried out, for example of a TMAH type (i.e., using tetramethyl ammonium hydroxide) with characteristics of isotropy so as to form an open area 8, set underneath the trenches 2 and in fluid communication with the same trenches 2. In particular, the isotropic chemical etch causes digging of the portion of the substrate 1 underneath the trenches 2, both in the direction of the depth (vertical direction of extension of the trenches 2) and, to a lesser extent, in a lateral direction, transverse to the vertical direction. The lateral extension of the open area 8 hence corresponds substantially to the extension of the mask 3 previously formed above the substrate 1.

Figure 1D:
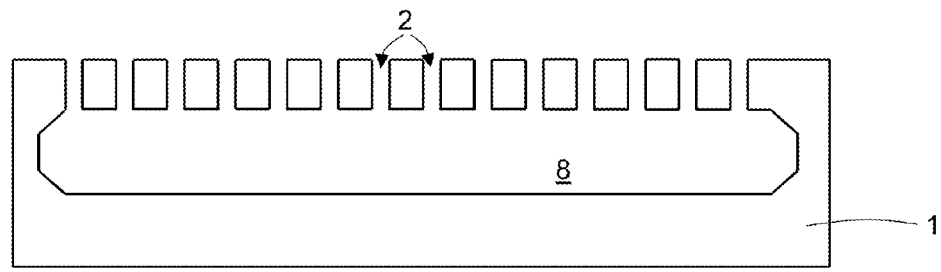

Next (FIG. 1d), the mask 3 is removed from the top surface 1a of the substrate 1, and the silicon oxide previously deposited is moreover removed, by means of a wet chemical etching. In particular, in this step, the spacers 6 are removed from the internal lateral walls of the trenches 2.

Figure 1E:
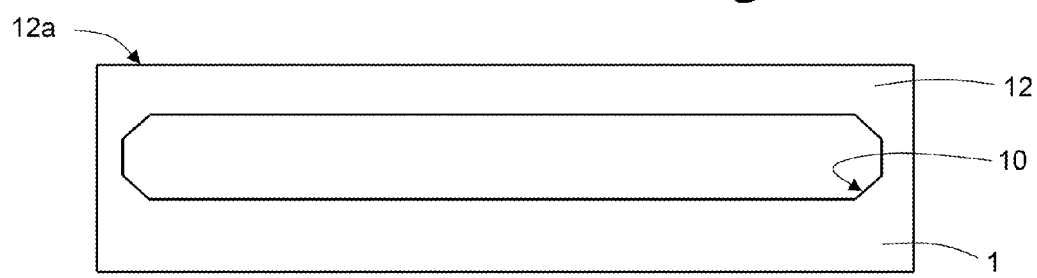

Then (FIG. 1e), a step of epitaxial growth of monocrystalline or polycrystalline silicon is carried out, preferably in deoxidizing environment (typically, in atmosphere with a high concentration of hydrogen, preferably in trichlorosilane —$SiHCl_3$), accompanied by a step of annealing, for example, in nitrogen atmosphere. As discussed in detail in the aforementioned U.S. Pat. No. 7,294,536 and U.S. Application Publication No. 2008/261345, the annealing step causes a migration of the silicon atoms, which tend to move into positions of lower energy.

Consequently, and also thanks to the short distance between the trenches 2, following upon this step, a buried cavity 10 is formed within the substrate 1, altogether isolated from the external environment and contained within the substrate itself, on top of which there remains a first surface layer 12, compact and uniform, which is constituted in part by monocrystalline or polycrystalline silicon atoms grown epitaxially and in part by migrated silicon atoms, and has a thickness for example of between 2 µm and 50 µm.

The buried cavity 10 defines, for example, a buried channel within the substrate 1, having the following dimensions: 30 µm in height (considered in the vertical direction, between a corresponding bottom wall-floor- and a top wall-roof or ceiling); 200 µm an in width; 1 cm in length; the channel is located at a depth of 25 µm underneath a respective top surface 12a of the first surface layer 12, which constitutes now a surface portion of the substrate 1 in which the channel is buried.

Clearly, the buried cavity 10 can have other geometries and define further buried structures (chambers or passages), according, in particular, to the characteristics of the mask 3 used for the process of formation of the trenches 2.

Next, according to a peculiar aspect of the present disclosure, on the top surface 12a of the first surface layer 12 a mask is defined, having an appropriate shape (as will be clarified better hereinafter), through which an oxidation step is carried out.

Figure 1F:
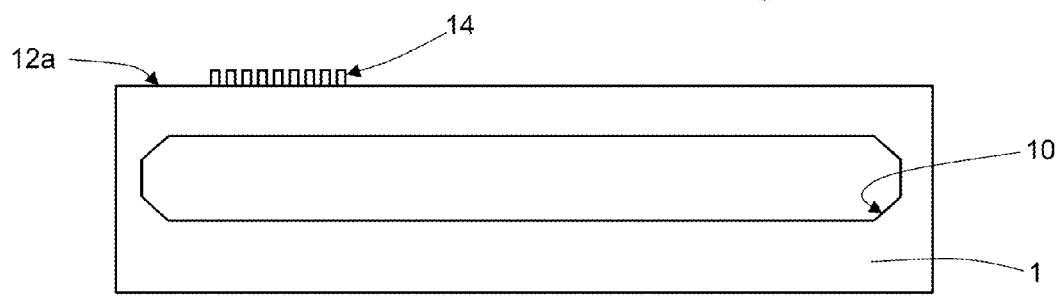

The structure of FIG. 1f is thus obtained, in which on the top surface 12a of the first surface layer 12, in an appropriate position (as will be clarified better hereinafter), an etching mask 14 is provided (of the "hard mask" type), formed by dielectric silicon oxide and having, for example, a lattice structure defining empty spaces arranged, in the example, at a regular distance apart (along the line of cross section of FIG. 1f).

Figure 1G:
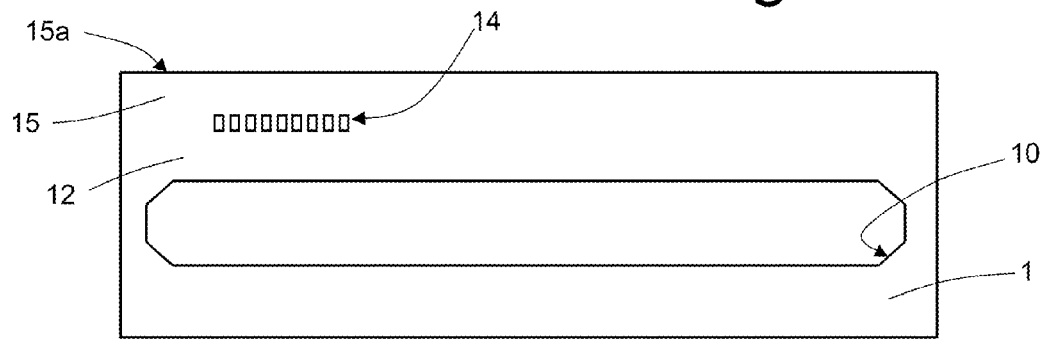

Then, as shown in FIG. 1g, the process continues with a step of epitaxial deposition, following upon which a second surface layer 15 grows epitaxially on the first surface layer 12. The two epitaxial layers form in this step a single homogeneous region of semiconductor material, in particular monocrystalline (or polycrystalline) silicon, moreover forming with the substrate 1a single (compact and uniform) monolithic body. The second surface layer 15 coats in particular the etching mask 14, which is englobed and integrated in the aforesaid homogeneous region of semiconductor material. For example, the thickness of the second surface layer 15 is of 13.2 μm.

Figure 1H:
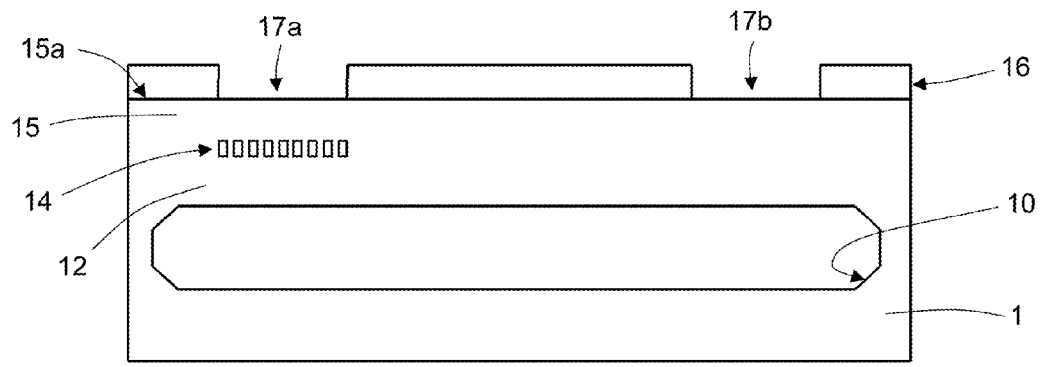

Next (FIG. 1h), a lithographic mask 16 is formed on a top surface 15a of the second surface layer 15, which leaves exposed a first access area 17a vertically corresponding to the etching mask 14, and possibly at least one second access area 17b, distinct from the first access area 17a.

Figure 1I:
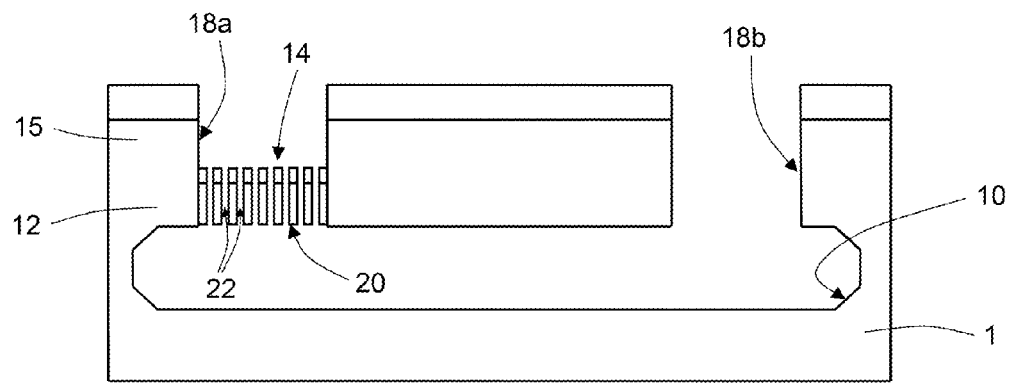

There is then carried out (FIG. 1i) a step of deep etching of the silicon, with characteristics of anisotropy and a depth of etching such as to involve the entire thicknesses of the first and second surface layers 12, 15 and reach the buried cavity 10.

In particular, the etch carried out frees the structure of the etching mask 14 in such a way that it is directly suspended above the buried cavity 10, thus forming a filter element 20, made of silicon, that filters particles entering/leaving the same buried cavity 10.

The etching mask 14 operates in fact as a shield for the etching and causes underlying portions of silicon to remain substantially intact, in effect replicating the lattice structure and conformation, in plan view, of the same etching mask 14 and consequently defining the filter element 20. The filter element 20 is thus formed by a lattice structure having vertical extension (with a height equal to the thickness of the first surface layer 12), defining inside it a plurality of openings 22 (or pores), such as to enable the passage of fluid and withhold, instead, undesirable particles (having dimensions not compatible with the dimensions of the openings 22). Between adjacent openings 22 vertical walls, or laminas, are present.

In particular, the deep etch of the silicon through the lithographic mask 16 leads to the formation of a first access duct 18a (for inlet or outlet, according to the direction of the fluid), which traverses the second surface layer 15 throughout its thickness and reaches the buried cavity 10 through the filter element 20. The filter element 20 is set at a distance from the top surface 15a of the second surface layer 15 equal to the thickness of the second surface layer 15, and is set between the first access duct 18a and the buried cavity 10.

It is hence emphasized that the etching step that leads to definition of the first access duct 18a in fluid communication with the buried cavity 10 leads automatically and at the same time to definition of the filter element 20 associated to the same first access duct 18a, thanks to the prior formation of the etching mask 14 in an appropriate position and with appropriate configuration; in particular, the filter element 20 is formed directly on the buried cavity 10.

The deep etch of the silicon through the lithographic mask 16 moreover leads to formation of a second access duct 18b (for outlet or inlet of the fluid, according to the direction of the fluid and to the function of the first access duct 18a), which, starting from the top surface 15a of the second surface layer 15, traverses throughout their thickness the first and the second surface layers 12, 15 and reaches the buried cavity 10. For example, the first access duct 18a can be set in a position corresponding to the inlet of a channel defined by the buried cavity 10, and the second access duct 18b in a position corresponding to the outlet of the same channel.

Figure 1J:
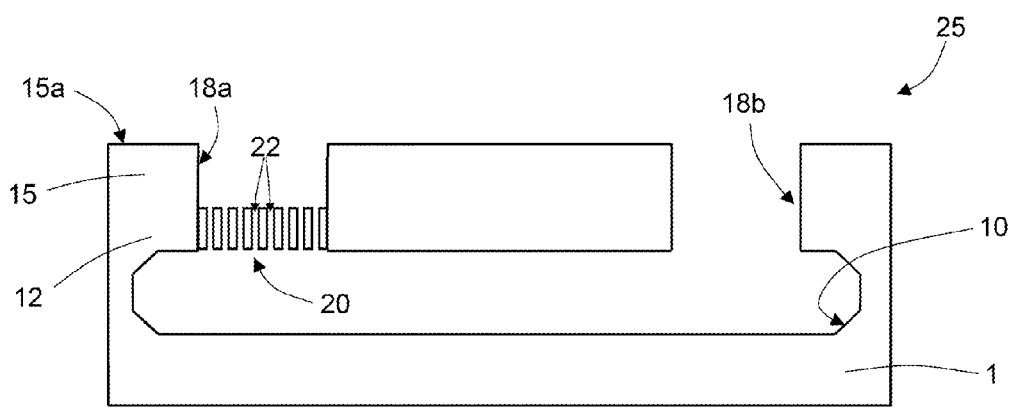

The process terminates (FIG. 1j), with a step of removal of the lithographic mask 16 from above the top surface 15a of the second surface layer 15, and moreover of the etching mask 14 from above the filter element 20, by means of respective steps of selective chemical etching.

At the end of these steps of removal, the formation of a micromechanical structure is hence obtained, designated as a whole by 25, including a buried cavity 10 (for example defining a channel), communicating with the external environment by means of a first access duct 18a and a second access duct 18b. Using the same process steps, in the micromechanical structure 25, a filter element 20 is formed, designed to enable removal of impurities and contaminants coming from outside towards the buried cavity 10, in the case where said filter element 20 is set in a position corresponding to an inlet duct, or else to enable the removal of impurities and contaminants moving from inside the buried cavity 10 towards the outside, in the case where the filter element 20 is set in a position corresponding to an outlet duct. The buried cavity 10 and the filter element 20 are integrated in one and the same monolithic body of semiconductor material.

It is moreover emphasized that:

the pattern of the etching mask 14 brings about, once the process is completed, the corresponding filtering pattern of the filter element 20; and the arrangement of the etching mask 14 itself with respect to the buried cavity 10 determines the corresponding position of the filter element 20, and, hence, its function with respect to filtering of the impurities coming from the outside towards the buried cavity 10, or moving from the buried cavity 10 itself towards the outside.

Figure 3A:
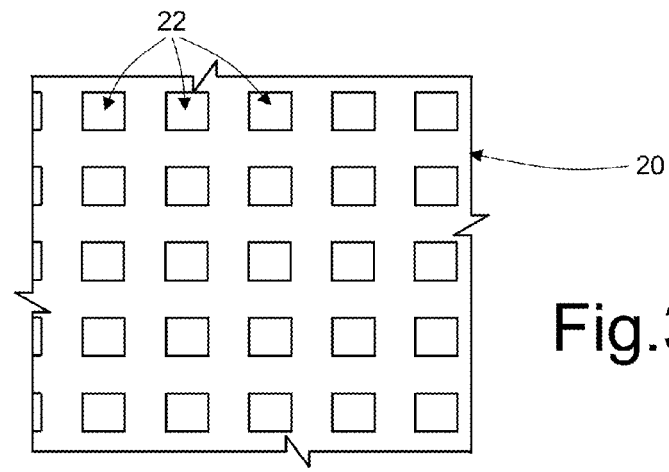
FIGS. 3a and 3b show schematic top plan views of a portion of a filter of the micromechanical structure of FIG. 1j, according to respective variant embodiments.
Figure 3B:
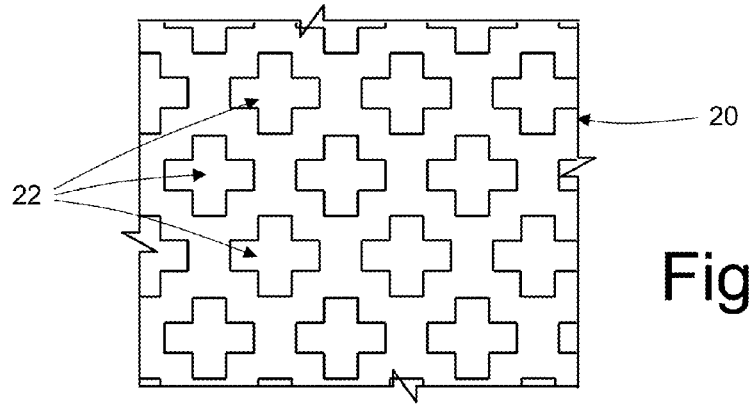

FIGS. 3a and 3b are schematic top plan views of two possible patterns of the filter element 20, in the case where it has openings 22 having a square shape or a cross shape, respectively (the lattice defining the same openings 22 having a corresponding shape). As it is clear, the etching mask 14 has in this case a similar shape, forming a lattice defining openings having in plan view a square shape or a cross shape, respectively. It is evident that the transverse extension of the filter element can vary according to the filtering desired and design of the microfluidic structure.

In particular, the openings 22 have micrometric or sub-micrometric dimensions, with a width (in the transverse direction) for example greater than 0.5 μm and smaller than 50 μm. In a per-se known manner, the shape and the optimal geometrical characteristics of the openings 22, and in general of the filter element 20, can in any case vary according to the impurities that are to be filtered, for example according to the dimensions or structural characteristics of the same impurities.

As previously indicated, the thickness of the first surface layer 12 determines the height (or thickness) of the openings 22 of the filter element 20 (and of the corresponding vertical walls or laminas), and hence, amongst other things, the filtering properties of the filter element 20. The thickness of the second surface layer 15 determines, instead, the height (or thickness) of the access duct in fluid communication with the filter element 20, and hence, for example, the corresponding characteristics of fluid flow-rate.

For example, in the case where the micromechanical structure 25 constitutes a micropump (as described in detail hereinafter), the thickness of the second surface layer 15 determines the height of the inlet and outlet pumping cavities.

The advantages of the manufacturing process according to the present disclosure are clear from the foregoing description.

It is emphasized in any case that the buried cavity 10, and the corresponding filter element 20, are provided during front-end processing steps (in particular, solely by means of etches from the front of the starting substrate of semiconductor material), without requiring back-end operations, with evident advantages in terms of reduction of the risks of contamination (both from outside and from inside) and of generation of impurities, and of simplification in the manufacturing process and reduction in the associated costs.

The resulting micromechanical structure 25 is extremely compact, in so far as it is obtained from a single monolithic body of a same semiconductor material, with the filter element 20, the buried cavity 10, and the corresponding access ducts 18a, 18b integrated inside the body.

In particular, the process described enables large thicknesses of the filter element 20, even in the order of tens of microns (for example, 30 μm), enabling reduction of the risk of mechanical failure, for example following upon impact or dropping.

In general, the presence of the filter element 20, and of the resulting micro-filtration effect, affords advantages from the standpoint of the fluidic path, in so far as it prevents external particles from entering undesirable areas of the micromechanical structure (and hinder, for example moving parts, such as valves), and moreover enables maintenance of a high level of purity of the flowing fluids (in particular in the case of administration of drugs to a patient).

In addition, it is advantageous the arrangement of the filter element 20 (and in particular of the corresponding vertical walls) parallel to the direction of flow of the fluids at inlet/outlet to/from the buried cavity 10.

The aforesaid characteristics render advantageous the use of the process described, and of the corresponding micromechanical structure 25, in a very wide range of applications.

Figure 4:
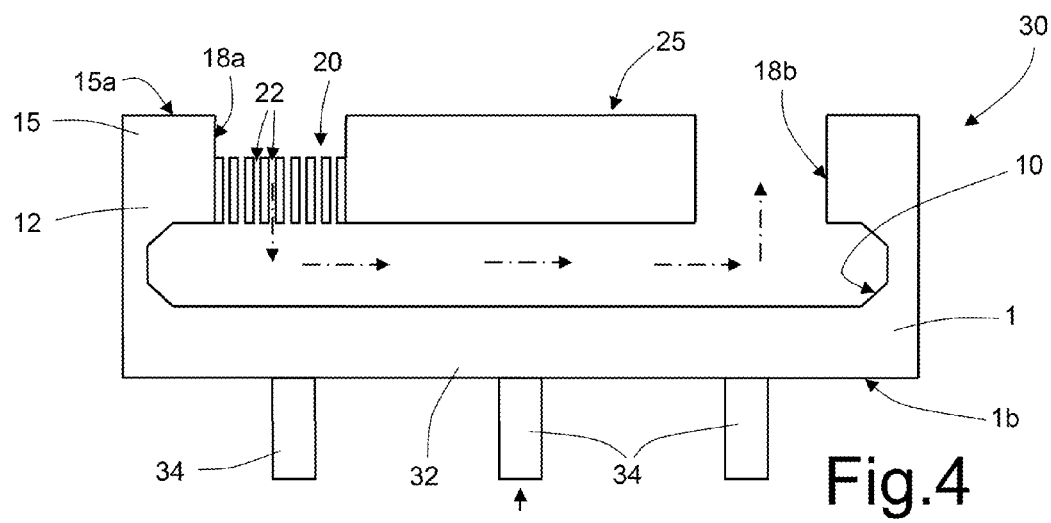
FIG. 4 shows a schematic cross section of a microfluidic device comprising the micromechanical structure of FIG. 1j.

For example, FIG. 4 shows an example of a microfluidic device, designated by 30, comprising the micromechanical structure 25, and in particular the substrate 1 inside which the buried cavity 10 and the filter element 20 are provided.

In the specific case, the microfluidic device 30 is a micropump for administration of drugs, for example for administration of insulin to a patient.

In this case, the manufacturing process, and in particular the step of TMAH isotropic etching (see the foregoing description), can be calibrated in such a way that the buried cavity 10 defines with a bottom surface 1b of the substrate 1 (opposite to the top surface 15a) an elastic membrane 32 (i.e., a region of semiconductor material with a thickness such as to have sufficient characteristics of deformability).

The microfluidic device 30 further comprises mechanical actuators 34, shown schematically (for example straps actuated by piezoelectric elements), which are coupled to the elastic membrane 32 (externally with respect to the substrate 1) and can be actuated to cause deformation of the same elastic membrane 32, in particular with alternating movement of compression and expansion. This alternating movement generates a flow of the fluid contained within the buried cavity 10, starting from a corresponding inlet towards a corresponding outlet (it is to be noted that, in a way not illustrated, inlet valves and outlet valves may be present to regulate and control the directionality and the inlet/outlet of the flow of fluid with respect to the buried cavity 10, the direction of which is indicated by the arrow in FIG. 4). The filter element 20, in the example shown in FIG. 4 set at inlet to the buried cavity 10, is traversed by the fluid in a direction parallel to its vertical extension, and prevents external particles from clogging the fluidic channel or hindering proper opening/closing of the inlet and/or outlet valves with consequent undesirable outflow of fluid. In particular, in the case illustrated, the filter element 20 is traversed by the fluids at inlet in the vertical direction.

Finally, it is clear that modifications and variations may be made to what has been described and illustrated herein, without thereby departing from the scope of the present disclosure.

For example, a possible process variant (not illustrated) can envisage formation of a pair of filter elements 20, set, with respect to the buried cavity 10, in a position corresponding both to the inlet duct and to the outlet duct. The number itself of the ducts for access to the buried cavity 10 can moreover differ with respect to the one illustrated.

Figure 5A:
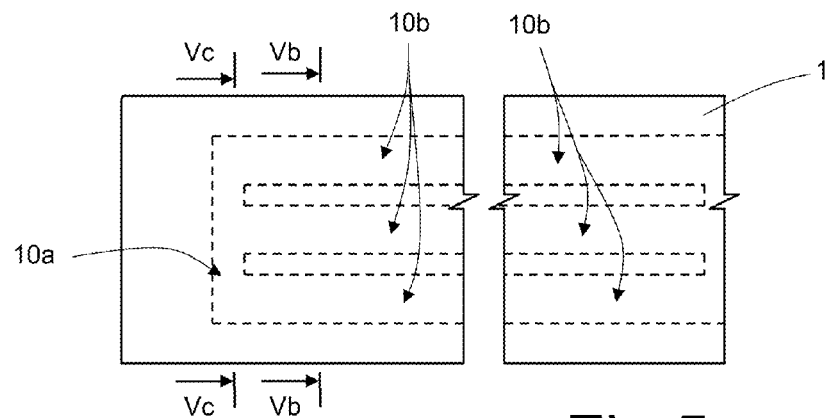
FIG. 5a shows a schematic and simplified top plan view of a portion of the micromechanical structure, in a variant embodiment.
Figure 5B:
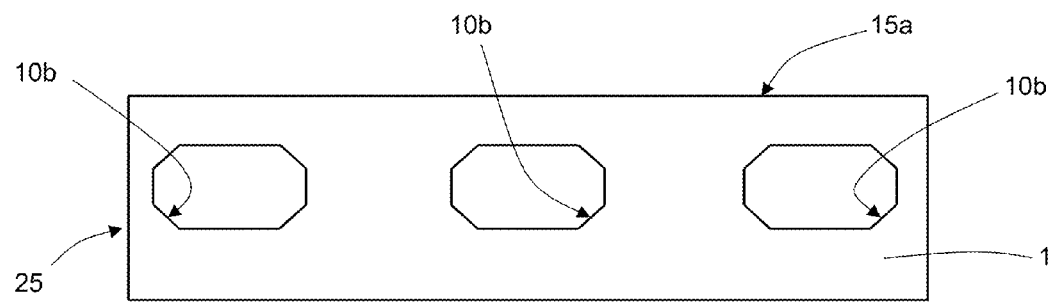
FIGS. 5b and 5c show cross sections of the micromechanical structure of FIG. 5a taken along respective lines of cross section.
Figure 5C:
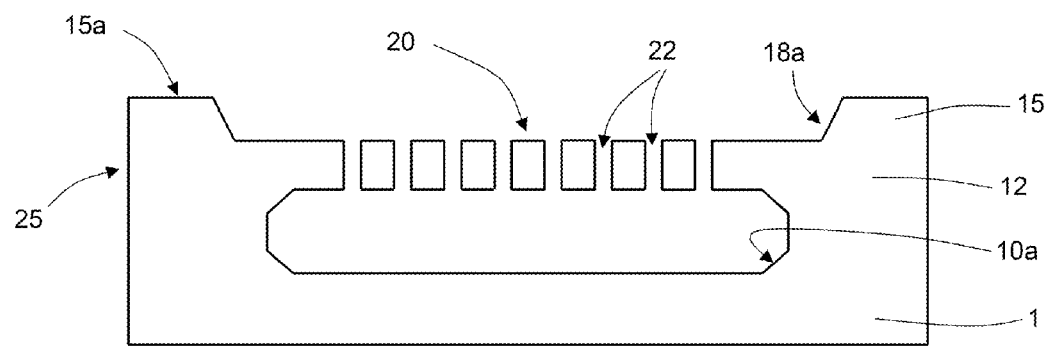

In the case of channel formation, the buried cavity 10 can possibly be divided into a number of sections, as shown schematically in FIGS. 5a-5c, which can then be connected in a single channel. In this case, the buried cavity 10 may have a lateral connection portion, designated by 10a, communicating directly with an access duct 18a, and, for example, three sections in length, designated with 10b, connected at the lateral connection portion 10a and converging into the single channel (not illustrated). This solution can be advantageous for preventing problems of formation of mechanical stresses and for distributing the pressures that may possibly be generated on the entire micromechanical structure 25.

The width of the filter element 20 (in a direction transverse to that of vertical extension) can possibly be smaller than that of the corresponding inlet/outlet access duct. Clearly, further shapes or patterns may equally be envisaged for the filter element 20, according to specific filtering desires.

Finally, it is evident that the process described for manufacturing of the filter element 20 is advantageously applied starting from a buried cavity 10 provided within a body of semiconductor material, irrespective of the way with which the same buried cavity was previously formed; in addition, it is evident that the micromechanical structure 25 can find advantageous use in all the applications in which the presence of a buried cavity provided with a filter element in fluid communication with the same buried cavity is required.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process for manufacturing a micromechanical structure, comprising:
    forming a buried cavity within a body of semiconductor material having a top surface, said buried cavity being separated from said top surface by a first surface layer of said body; and
    forming a first access duct configured to enable fluid communication between said buried cavity and an environment external to said body;
    forming an etching mask on said top surface at a first access area;
    forming a second surface layer on said top surface and said etching mask;
    removing by etching, at said first access area, a portion of said second surface layer, and an underlying portion of said first surface layer not covered by said etching mask until said buried cavity is reached, said etching thus forming both said first access duct and a filter element, set between said first access duct and said buried cavity and formed by a remaining portion of said first surface layer covered by said etching mask.

2. The process according to claim 1, wherein said etching mask has a lattice structure defining a plurality of openings having sub-micrometric or micrometric dimensions.

3. The process according to claim 1, wherein said etching mask is of a "hard mask" type.

4. The process according to claim 1, wherein forming said second surface layer comprises growing epitaxially said second surface layer on said first surface layer; said second surface layer and said body forming a single monolithic structure of semiconductor material.

5. The process according to claim 4, wherein said filter element is integrated within said monolithic structure, at a distance from a respective top surface of said second surface layer, said distance being equal to a thickness of said second surface layer; wherein said thickness of said second surface layer moreover defines a height of said first access duct.

6. The process according to claim 4, wherein said semiconductor material is monocrystalline or polycrystalline silicon, and said etching mask is made of silicon oxide or silicon dielectric.

7. The process according to claim 1, further comprising removing said etching mask at the end of said etching.

8. The process according to claim 1, wherein said etching is carried out through a lithographic mask formed on a top surface of said second surface layer, said lithographic mask having a first opening in a position corresponding to said first access area.

9. The process according to claim 8, wherein said lithographic mask has a second opening in a position corresponding to a second access area; and wherein said etching includes removing, at said second access area, a portion of said second surface layer and an underlying portion of said first surface layer until said buried cavity is reached, thus forming a second access duct, designed to enable fluid communication between said buried cavity and said external environment.

10. The process according to claim 9, wherein said first access duct is an inlet/outlet duct for introduction/extraction of fluid into/from said buried cavity, and said second access duct is an outlet/inlet duct for said fluid.

11. The process according to claim 1, wherein forming said buried cavity comprises:
    forming trenches within a surface portion of a substrate of semiconductor material;
    carrying out chemical etching through said trenches to form an open area in said substrate underneath said trenches and in fluid communication with said trenches;
    growing epitaxially, on said surface portion of said substrate, said first surface layer, that forms, with said substrate, said body of semiconductor material and covers said trenches and said open area with respect to said external environment; and
    annealing said body.

12. A method comprising:
    forming a buried cavity in a body of semiconductor material, the body having a top surface that is separated from the buried cavity by a first portion;
    forming a first access duct in the first portion of the body, the first access duct being configured to enable fluid communication between the buried cavity and an environment external to the body;
    forming an etching mask over the body in the first portion; and
    etching the body through the etching mask to form a filter element and a second access duct in the first portion such that the filter element is located in the second access duct at a distance from the top surface, the filter element including a plurality of trenches in the body, each of the trenches being configured to enable fluid communication between the buried cavity and the environment external to the body.

13. The method according to claim 12, wherein forming the buried cavity comprises:
    forming trenches in a first portion of a semiconductor substrate;
    etching through the trenches to form an open area in the semiconductor substrate under the trenches and in fluid communication with the trenches; and
    epitaxially growing semiconductor material between the trenches and forming the buried cavity in the body of semiconductor material.

14. The method according to claim 13, further comprising annealing the body.

15. The method according to claim 12, wherein the body includes silicon.

16. The method according to claim 12, wherein the second access duct and the filter element form a first inlet for fluid to enter the buried cavity and the first access duct is an outlet for fluid exiting the buried cavity.

17. A method comprising:
    forming a buried cavity in a body of semiconductor material;
    forming a first access duct in the body, the first access duct being configured to enable fluid communication between the buried cavity and an environment external to the body; and
    etching a plurality of trenches in the body to form a filter element in the body and a second access duct, the filter element being made of the body of semiconductor material and located in the second access duct at a distance from a top surface of the body, the second access duct and the filter element being configured to enable fluid communication between the buried cavity and the environment external to the body.

18. The method according to claim 17, further comprising forming an etching mask on a surface of the body prior to etching the plurality of trenches.

19. The method according to claim 17, wherein forming the buried cavity comprises:
    forming trenches in a first portion of a semiconductor substrate;
    etching through the trenches to form an open area in the semiconductor substrate under the trenches and in fluid communication with the trenches; and
    epitaxially growing semiconductor material between the trenches and forming the buried cavity in the body of semiconductor material.

* * * * *